United States Patent [19]

Kondo

[11] Patent Number: 5,322,815
[45] Date of Patent: Jun. 21, 1994

[54] METHOD FOR PRODUCING SEMICONDUCTOR DEVICE WITH MULTILAYER LEADS

[75] Inventor: Toshihiko Kondo, Suwa, Japan

[73] Assignee: Seiko Epson Corporation, Tokyo, Japan

[21] Appl. No.: 83,473

[22] Filed: Jun. 30, 1993

Related U.S. Application Data

[62] Division of Ser. No. 742,808, Aug. 9, 1991, Pat. No. 5,250,846.

[30] Foreign Application Priority Data

Aug. 9, 1990 [JP] Japan ............................. 2-210806
Jul. 16, 1991 [JP] Japan ............................. 3-175392

[51] Int. Cl.⁵ .................................... H01L 21/283
[52] U.S. Cl. ................................ 437/193; 437/195; 437/200; 437/918; 437/978
[58] Field of Search ............... 437/193, 200, 918, 191, 437/195, 978; 148/DIG. 19, DIG. 147; 257/755, 756

[56] References Cited

U.S. PATENT DOCUMENTS

| 4,292,730 | 10/1981 | Ports ............................. 257/756 |
| 4,604,789 | 8/1986 | Bourassa ......................... 437/918 |
| 4,849,344 | 7/1989 | Desbiens et al. .................. 437/31 |
| 4,968,645 | 11/1990 | Baldi et al. ..................... 437/200 |
| 5,013,678 | 5/1991 | Winnerl et al. ................... 437/52 |

FOREIGN PATENT DOCUMENTS

63-207180 8/1988 Japan ............................. 257/756

OTHER PUBLICATIONS

Wolf, et al., Silicon Processing, Lattice Press, 1986, vol. 1, pp. 384–400.

*Primary Examiner*—T. N. Quach
*Attorney, Agent, or Firm*—Spensley Horn Jubas & Lubitz

[57] ABSTRACT

A semiconductor device having multi-layered leads having a first lead portion including a polycrystalline silicon layer and a titanium silicide layer, and a second lead portion formed over the first lead portion and made up of a polycrystalline silicon layer. An intermediate insulating layer is provided between the first and second lead portions. The intermediate insulation layer and the underlying titanium silicide layer are provided with contact holes aligned with each other so as to allow the polycrystalline silicon of the second lead portion to be in direct contact with the polycrystalline silicon layer of the first lead portion without interposing therebetween the titanium silicide layer at the contact hole portion.

2 Claims, 5 Drawing Sheets

METHOD FOR PRODUCING SEMICONDUCTOR DEVICE WITH MULTILAYER LEADS

This is a division of application Ser. No. 07/742,808, filed on Aug. 9, 1991. Now U.S. Pat. No. 5,250,846.

BACKGROUND OF THE INVENTION

The present invention relates to a semiconductor device and a method for producing the same, and more particularly to a highly miniaturized semiconductor device and a method for producing such highly miniaturized semiconductor device.

FIG. 4A shows one example of a conventional semiconductor device such as a transistor. On a silicon semiconductor substrate 1, there are provided a dielectric device isolation layer 2 by a LOCOS method, a gate insulating layer 3, a side wall insulation layer 4, low impurity concentration diffusion layer regions 5a and high impurity concentration (N+ type) diffusion layer regions 5b serving as a source and a drain, and a gate electrode 6 formed of polycrystalline silicon containing impurities. FIG. 4A shows a fabrication stage in which an oxide film which had been formed over the gate electrode 6 and the diffusion layer regions 5b has been removed therefrom.

Recent technical trends are pointing toward high-speed semiconductor devices having extremely small dimensions. Therefore, an extremely minute pattern size, and particularly fine dimensions for the gate electrode 6 and the high impurity concentration diffusion layer regions 5b are required. However, miniaturization tends to increase lead resistance, thereby leading to degradation of transistor efficiency.

In order to obviate this drawback, it has been proposed to form a refractor silicide layer upon the gate electrode 6 and the high impurity concentration diffusion layer regions 5b. Refractory metal silicide has been considered because it has a sheet resistivity of from 2 to 10 Ω per square, which resistivity is considerably smaller than that of the polycrystalline silicon material of the gate electrode 6 and the high impurity concentration diffusion layer 5b, so that increases in the resistance of the leads attendant to miniaturization of the device can be avoided or at least minimized.

One proposal made by coworkers of the inventors with respect to use of the silicide layer in a semiconductor device is shown in FIGS. 4B through 4D.

Firstly, in FIG. 4B, a titanium layer 7 having a thickness of from 300 to 1500 Å is formed by a known sputtering method over the entire surfaces of the dielectric isolation 2, the gate insulating layer 3, the side wall insulation region 4, the low impurity concentration diffusion layer regions 5a, the high impurity concentration diffusion layer regions 5b and the gate electrode 6 made of polycrystalline silicon containing impurities, those elements being formed on the silicon substrate 1. Then, a heat treatment is conducted at a temperature ranging from 500° C. to 900° C. in a nitrogen atmosphere.

As a result of the heat treatment, the titanium layer 7 in contact with the silicon, i.e., with the gate electrode 6 and the high impurity concentration diffusion layer regions 5b, is converted into titanium silicide 8 because of the reaction between the titanium and the silicon, whereas the remaining portions of titanium layer 7 in contact with the dielectric isolation 2, the side wall dielectric isolation 4 and the gate insulator 3 is converted into a titanium nitride, TiN, because of the reaction between the titanium and the ambient nitrogen gas.

Thereafter, the titanium nitride layer is subjected to etching by a mixture of ammonia and hydrogen peroxide, so that only regions of titanium silicide 8 remain on a top surface of the interim device, as best shown in FIG. 4C. Thus, titanium silicide 8 is present only on gate electrode 6 and diffusion layer regions 5b.

FIG. 4D shows an electrical connection achieved on one N+type diffusion layer region 5b in a multi-layered lead structure in which a first lead portion consists of the diffusion layer region 5b and a region of titanium silicide 8. An intervening, or intermediate, insulation layer 9 is provided over regions of titanium silicide 8 and dielectric isolation 2, and a second, upper, lead portion 11 of polycrystalline silicon is deposited on insulation layer 9. For electrically connecting the first and the second lead portions together, a contact hole 10 reaching the region of titanium silicide 8 is formed in insulation layer 9 at a position above the diffusion layer region 5b by a conventional dry etching method which involves masking with a photo-resist. Accordingly, the polycrystalline silicon of the second lead layer 11 can enter into the contact hole to be brought into contact with the first lead portion. Thus, the upper polycrystalline silicon layer 11 can be connected to the diffusion layer region 5b via the titanium silicide layer 8. In other words, the first and the second lead portions can be electrically connected together.

FIG. 4E is a cross-sectional view of a semiconductor device according to another proposal. The cross-sectional plane of FIG. 4E is perpendicular to that of FIGS. 4A through 4D for description of an electrical connection on the N-type polycrystalline silicon. In this proposal, a first lead portion of a multi-layered lead consists of the gate electrode 6 formed of polycrystalline silicon with added impurities and a layer of titanium silicide 8 formed thereon. Similar to FIG. 4D, the intermediate insulation layer 9 is formed over the silicide layer 8 and the dielectric isolation 2, and a second lead portion 11 made of polycrystalline silicon is formed over the intermediate insulating layer 9. To be more specific, a contact hole 10 reaching the titanium silicide layer 8 is formed in intermediate insulation layer 9 at a position above gate electrode 6 by a conventional dry etching method. Through the contact hole 10, the gate electrode 6 and the second lead portion 11 are electrically connected together via the titanium silicide layer 8. That is, the material of the second lead portion 11 enters into the contact hole 10, so that the polycrystalline silicon of the upper lead portion 11 is brought into contact with the polycrystalline silicon of the electrode 6 through the titanium silicide layer 8.

In the above-mentioned dry etching process to form hole 10 at an intended portion of insulation layer 9, photoresist is removed for providing the contact hole 10 by the application of an oxygen plasma or sulfuric acid, and a part of the titanium silicide 8 is exposed upon formation of the contact hole 10. Thus, the surface is exposed to an oxygen atmosphere. Further, upon completion of the dry etching process, a part of the titanium silicide layer 8 at a position within the contact hole 10 is exposed to an oxygen atmosphere. Consequently, an unwanted oxide film may be formed at the exposed surface of the titanium silicide 8.

A report has been released relating to ohmic contact between titanium silicide and polycrystalline silicon in a provisional contribution No. 2 P58829a-SB-20 released at No. 37, Applied Physical Society, held in 1990, and entitled "PolySi direct contact characteristic onto TiSi$_2$ membrane". According to the report, if no titanium silicide exists, an inferior product rate is almost zero. On the other hand, provided that the titanium silicide layer 5 is provided, the inferior product rate may be lowered if a pre-treatment is effected so as to remove an oxide film over the titanium silicide by BHF (buffered hydrofluoric acid, which is a mixed acid of hydrofluoric acid and ammonium fluoride). Here, if structures shown in FIGS. 4D and 4E are premised, and if such BHF treatment is conducted for etching the oxidized surface of the titanium silicide layer 8, excessive etching occurs. That is, the hydrofluoric acid etches not only the titanium silicide 8 within contact hole 10 but also a portion radially outside the boundary of contact hole 10 as shown in FIG. 5. As a result, an unwanted undercut portion 10$a$ is provided by the excessive etching. This undercut may lead to generation of voids in a resultant semiconductor device, to thereby degrade reliability of the device.

The contribution reported that improvement can be made in the ohmic contact characteristic, if the polycrystalline silicon is deposited on the titanium silicide layer without the BHF treatment and ion beam mixing is carried out at a boundary surface thereof by arsenic ion implantation or silicon ion implantation. However, according to the report, inferior production rate was still high with respect to the N+ diffusion layer even by the implantation of arsenic or silicon ions. Generally, in ion beam mixing, the implanted ions impart energy to atoms in a substrate, and the atoms run out of lattice points, so that atoms of the substrate are mixed with atoms of an upper thin layer. Here, the high ratio of the inferior production is considered to be due to the fact that the oxide film of the titanium silicide, the film being positioned at the boundary between the titanium silicide layer and the polycrystalline silicon layer, prevents the atoms from passing therethrough. In this respect, an improvement was made on the inferior production rate with respect to N-type polycrystalline silicon in comparison With the N+diffusion layer. The reason therefor resides in that the atoms may easily pass through the oxide film during the ion mixing process in case of implantation on the N-type polycrystalline silicon layer rather than N+diffusion layer. In an attempt to further improve the atom mixing effect, if the ion implantation is carried out after the removal of the oxide film by the BHF treatment, then excessive etching by the hydrofluoric acid may disadvantageously occur, as described above. As a result, substantial improvements would not be attainable.

SUMMARY OF THE INVENTION

It is therefore an object of the present invention to provide an improved semiconductor device having a multi-lead arrangement and a method for producing the same in which a first lead portion can be electrically connected to a second lead portion formed of polycrystalline silicon with a sufficient ohmic contact characteristic and high reliability.

This and other objects of the present invention are attained by providing a semiconductor device comprising a substrate, a first lead layer comprising a polycrystalline silicon layer containing therein impurities and formed on the substrate, and a titanium silicide layer formed over the polycrystalline silicon layer, an intermediate insulating layer formed on the first lead layer, the intermediate insulating layer being penetrated by a contact hole, and a second lead layer made of polycrystalline silicon and formed over the intermediate insulating layer, the polycrystalline silicon of the second lead layer extending into the contact hole to contact the first lead layer, and the titanium silicide layer being absent from an area defined by the contact hole to allow direct contact of the polycrystalline silicon layer of the first lead layer with the polycrystalline silicon of the second lead layer in the contact hole.

In another aspect of the present invention, there is further provided a method for producing a semiconductor device comprising the steps of forming a polycrystalline silicon layer containing impurities over a substrate, forming an oxide film layer over a restricted area of the polycrystalline silicon layer, forming a titanium silicide layer over the polycrystalline silicon layer except for the part or parts covered by the oxide film layer for providing a first lead layer in combination with the polycrystalline silicon layer, forming an intermediate insulating layer over the titanium silicide layer and the oxide film layer, forming a contact hole in a restricted area of the intermediate insulating layer at a position above the oxide film layer and in the oxide film layer, the contact hole reaching the surface of the polycrystalline silicon layer underneath the oxide film layer, and forming a second lead layer made up of polycrystalline silicon over the intermediate insulating layer, and introducing the polycrystalline silicon of the second lead layer into the contact hole for providing a direct contact of the polycrystalline silicon of the second lead layer with the polycrystalline silicon layer of the first lead layer.

BRIEF DESCRIPTION OF THE DRAWING

FIGS. 2A through 2C are cross-sectional views in a plane perpendicular to the plane of FIGS. 1 and in which:

FIG. 2A shows a process stage for forming a residual oxide film layer and a titanium layer according to a second embodiment of this invention;

FIG. 2B shows a process stage for forming a titanium silicide layer according to the second embodiment of this invention; and FIG. 2c shows a completed semiconductor device according to the second embodiment in which an electrical connection on an N+ diffusion layer is achievable.

DESCRIPTION OF THE PREFERRED EMBODIMENTS

Figure 1A:
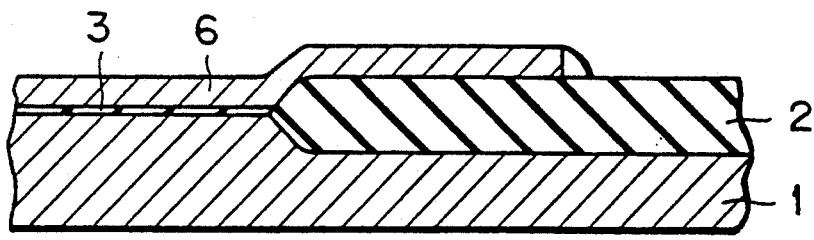
FIG. 1A is a cross-sectional view showing an initial stage in a process for making a semiconductor device according to a first embodiment of this invention.

A semiconductor device having a multi-lead layer arrangement according to a first embodiment of this invention will be described firstly with reference to FIG. 1D. The semiconductor device includes a silicon semiconductor substrate 1, dielectric isolation 2 formed by a LOCOS method on substrate 1, a gate insulator 3, a gate electrode 6 formed of polycrystalline silicon containing impurities, and a titanium silicide layer 8 formed over gate electrode 6 and diffusion layers 5a, 5b, which can be seen in FIGS. 2. Gate electrode 6 and silicide layer 8 serve as a first lead portion. The semiconductor device further includes an intermediate insulating layer 9 formed over the titanium silicide layer 8 and over the dielectric isolation 2, and an upper lead or second lead portion 11 made up of polycrystalline silicon and formed over the intermediate insulating layer 9. The intermediate insulating layer 9 as well as the titanium silicide layer 8 are formed with a contact hole 10 at a location above gate electrode 6. Thus, the second lead portion 11 is in direct contact with an upper surface of the gate electrode 6.

Figure 5:
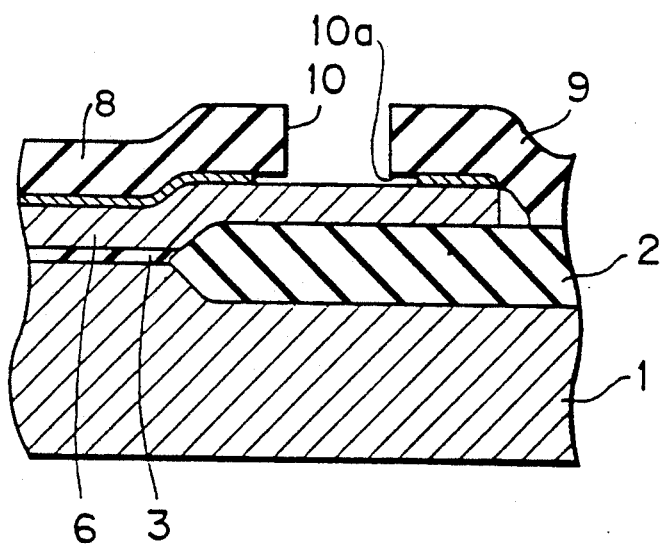
FIG. 5 is a cross-sectional view illustrating an unwanted undercut at a contact hole portion according to one of the preceding proposals.

More specifically, according to the above described preceding proposal, the upper or second lead portion 11 would be connected to the gate electrode 6 through the titanium silicide layer 8 within the contact hole 10. However, in the depicted embodiment of the invention, no titanium silicide is provided in the contact hole 10. The upper lead portion 11 can directly contact the gate electrode 6 within the contact hole 10. In other words, the polycrystalline silicon of the gate electrode 6 and the polycrystalline silicon of the upper or second lead portion 11 directly contact each other. Further, a residual oxide film layer 12 is provided immediately around the contact hole 10 and between the intermediate insulating layer 9 and the gate electrode 6. Therefore, no void remains in the completed semiconductor device contrary to the preceding proposal shown in FIG. 5, i.e., no undercut occurs.

A method for producing the semiconductor device according to the first embodiment of this invention will next be described with reference to FIGS. 1A thru 1D wherein like parts and components are designated by the same reference numerals as those shown in FIGS. 4A thru 4E. Further, it should be noted that the cross-sectional plane of FIGS. 1A thru 1C is perpendicular to that of FIGS. 4A thru 4C.

In FIG. 1A, shown are the silicon semiconductor substrate 1, the dielectric isolation 2, the gate insulator 3 and the gate electrode 6 formed of polycrystalline silicon with added impurities. Starting with this arrangement, an oxide film having a thickness of not less than 150 Å is deposited over the entire surfaces of dielectric isolation 2 and gate electrode 6 by a CVD (chemical vapor deposition) method. Then, parts of that oxide film are removed from these surfaces except for a portion at which the contact hole 10 is to be formed. Thus, a residual oxide film layer 12 is provided on the portion provided for a contact hole above gate electrode 6. The residual oxide film layer 12 has a size, or surface extent, slightly larger than the size, or diameter, of contact hole 10 to allow for alignment accuracy tolerances. FIG. 1B shows the residual oxide film layer 12 provided on the corresponding portion of the gate electrode 6.

Figure 1B:
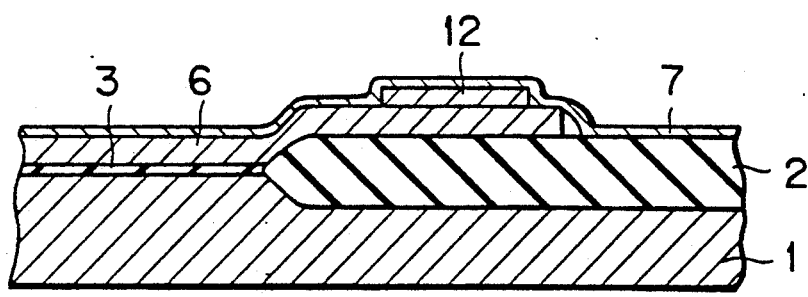
FIG. 1B is a cross-sectional view of a stage of the process for forming a residual oxide film layer and a titanium layer according to the first embodiment of this invention.
Figure 1C:
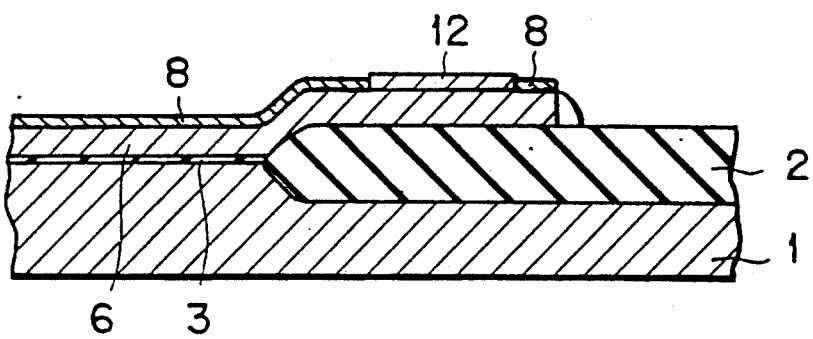
FIG. 1C is a cross-sectional view showing a stage for forming a titanium silicide layer according to the first embodiment of this invention.

Next, as shown in FIG. 1B, a titanium layer 7 having a thickness of from 300 to 1500 Å is formed over the entire surfaces of gate electrode 6, residual oxide film layer 12 and dielectric isolation 2 by a sputtering method. Then, annealing is conducted in a nitrogen atmosphere at a temperature of from 500° C. to 900° C. As a result, a titanium layer portion 7 in contact with the polycrystalline silicon is converted into a titanium silicide while the remaining titanium layer portion is converted into a titanium nitride. That is, the titanium layer portion 7 positioned above gate electrode 6 becomes titanium silicide, while the other titanium layer portions 7 on dielectric isolation 2 and on residual oxide film layer 12 provided on the gate electrode 6 become titanium nitride.

Thereafter, the titanium nitride layer is subjected to etching with a mixture of ammonia and hydrogen peroxide in order to remove the titanium nitride layer portions. Consequently, as shown in FIG. 1C, the titanium silicide layer 8 is only provided directly on the surface of gate electrode 6 and not on residual oxide film layer 12. As described above, the gate electrode 6 and the titanium silicide layer 8 will constitute a first lead layer portion in the multi-lead layers arrangement.

Next, the intermediate insulating layer 9 is formed over the entire surface of titanium silicide layer 8, on residual oxide film layer 12 and on dielectric isolation 2, and then the contact hole 10 is formed by dry etching in the intermediate insulating layer 9 at a location above residual oxide film layer 12. This contact hole 10 is formed by penetration through residual oxide film layer 12 contiguous with penetration through intermediate insulating layer 9.

Then, the upper lead layer 11 serving as the second lead layer portion and made primarily of polycrystalline silicon is formed over intermediate insulating layer 9. In this case, the polycrystalline silicon material of upper lead layer 11 enters into contact hole 10 and is brought into direct contact with the upper surface of gate electrode 6. That is, direct contact between polycrystalline silicon layers are realized. Accordingly, the upper lead layer portion 12 as the second lead portion can be formed over the first lead layer portion which contains the titanium silicide layer 8 with a high conductivity contact and high reliability. Incidentally, a residual portion of oxide film layer 12 is retained in the resultant semiconductor device around contact hole 10 and between intermediate insulating layer 9 and gate electrode 6, since the initial size of layer 12 was set slightly greater than the size of contact hole 10. Thus, the formation of the undercut can be eliminated.

In the semiconductor device according to the first embodiment described above, a part of titanium silicide layer 8 on gate electrode 6 is replaced by residual oxide film layer 12 and contact hole 10 is formed through intermediate insulating layer 9 and residual oxide film layer 12 in order to provide the electrical connection on the N-type polycrystalline silicon layer. However, this inventive concept is available for an electrical connection on the N+diffusion layer 5b shown in FIGS. 2.

Figure 2A:
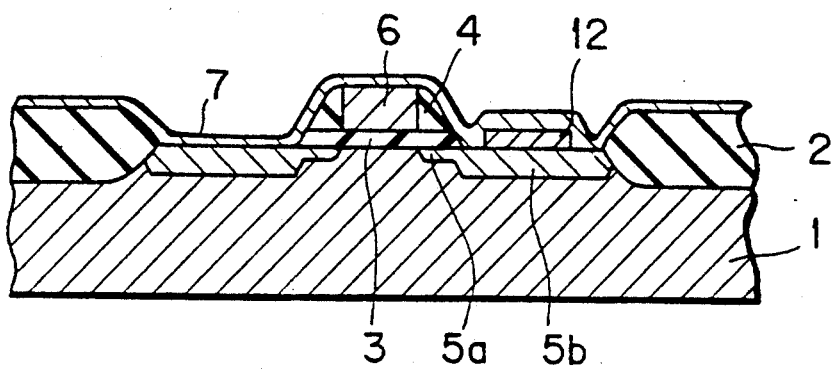
Figure 2B:
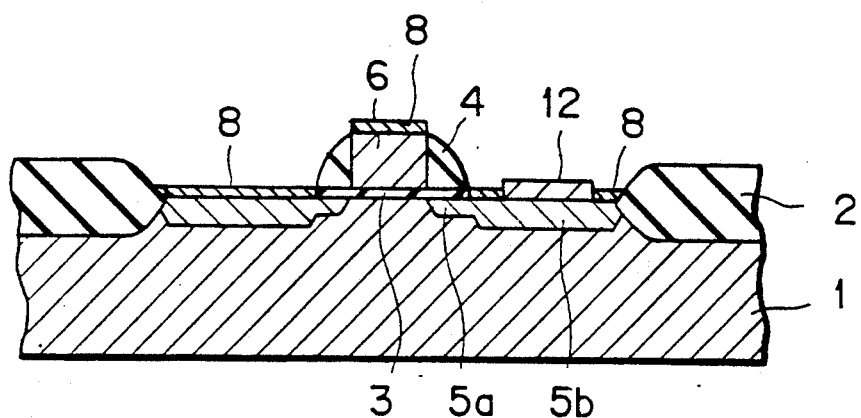
Figure 2C:
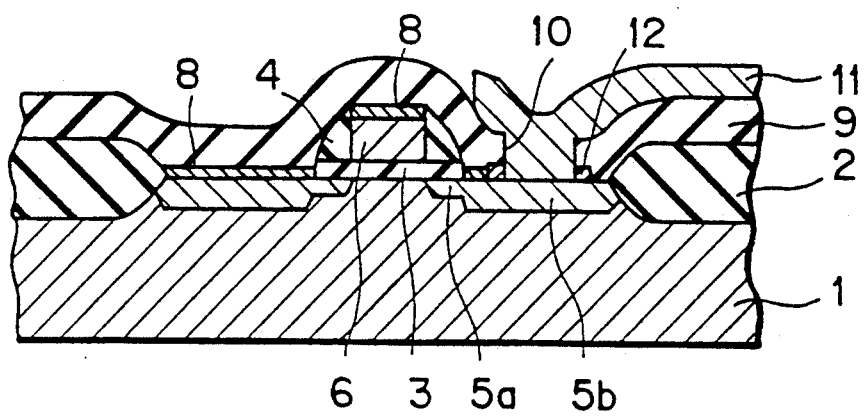
Figure 4A:
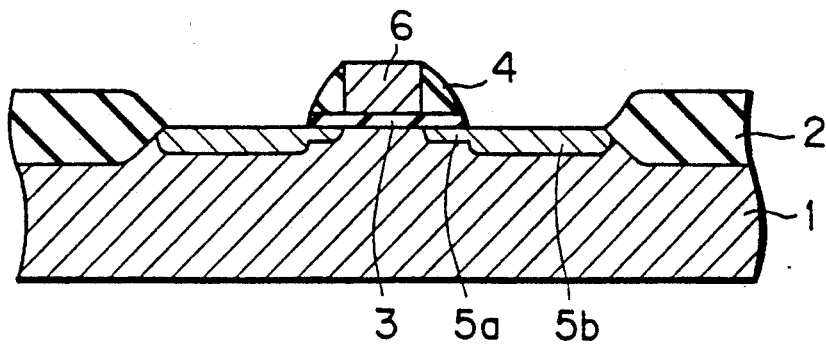
FIG. 4A is a cross-sectional view showing a first process stage for making a semiconductor device according to a conventional process.
Figure 4B:
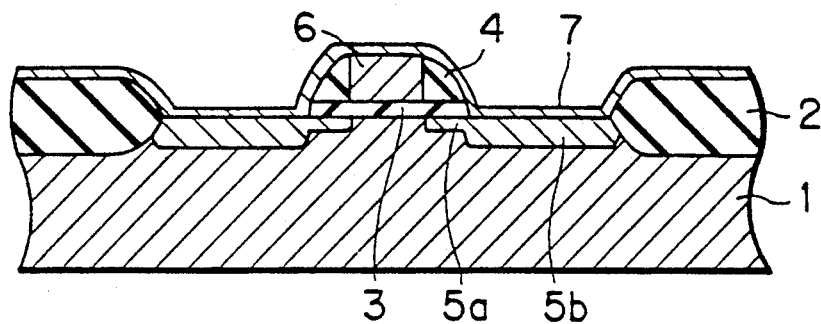
FIG. 4B is a cross-sectional view of a stage of a process for forming a titanium layer according to the previously mentioned proposal preceding the invention.
Figure 4C:
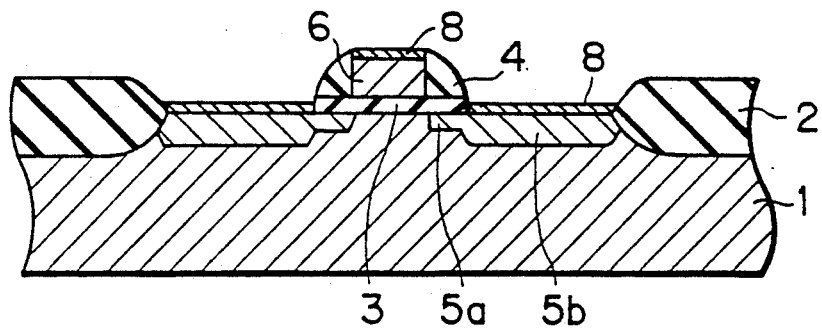
FIG. 4C is a cross-sectional view showing a process stage for forming a titanium silicide layer according to the previously mentioned proposal.
Figure 4D:
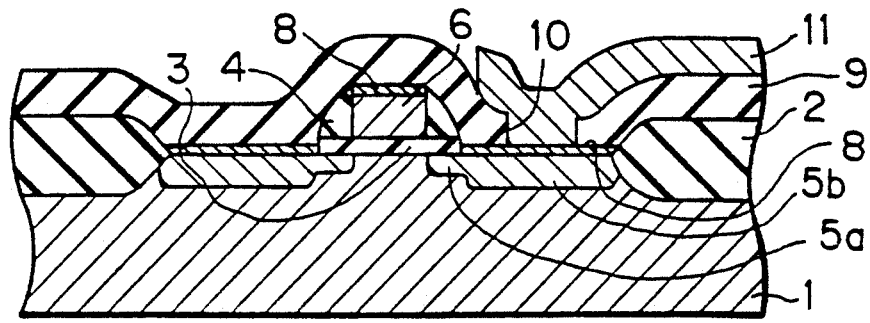
FIG. 4D is a cross-sectional view showing a completed semiconductor device according to the previously mentioned proposal in which an electrical connection on an N+ diffusion layer is achieved.

To be more specific, a semiconductor device according to a second embodiment of this invention shown in FIG. 2C has a structure approximately the same as that of the device shown in FIG. 4D. However, in the second embodiment, polycrystalline silicon of an upper lead layer 11 (second lead portion) is in direct contact with the diffusion layer 5b through a contact hole 10 formed in an intermediate insulating layer 9 at a position above the diffusion layer 5b. In other words, in the structure shown in FIG. 4D, the upper lead layer portion 11 is contacted with the diffusion layer 5b by way of the titanium silicide layer 8 in contact hole 10, whereas in the second embodiment of the invention, no titanium silicide exists at the electrically connecting portion so that direct contact can be effected between diffusion layer 5b and the upper lead layer portion 11. Similar to the first embodiment, a residual oxide film layer 12 is retained around contact hole 10 and between intermediate insulating layer 9 and diffusion layer 5b. Therefore, no void is provided at the corresponding portion.

The semiconductor device according to the second embodiment can be manufactured by a process similar to the above described process. That is, similar to the process in connection with FIG. 1B, as shown in FIG. 2A, an oxide film layer portion is still retained on a predetermined portion of diffusion layer 5b at which the electrical connection is intended so as to provide a residual oxide film layer 12. Then, a titanium layer 7 is formed over the entire surface and a titanium silicide layer 8 is formed over the entire surface other than the residual oxide film layer 12, side wall insulation layers 4 and dielectric device isolation layer 2 (FIG. 2B), similar to the process described in connection with FIG. 1C. A first lead portion is provided by the diffusion layer 5b and the titanium silicide layer 8.

Then, referring to FIG. 2C, an intermediate insulating layer 9 is formed over the entire surfaces of titanium silicide layer 8, residual oxide film layer 12 and dielectric isolation 2, and a contact hole 10 is formed by dry etching in intermediate insulating layer 9 at a location above residual oxide film layer 12. In this case, hole 10 also extends through residual oxide film layer 12 underneath intermediate insulation layer 9. Then, the upper lead layer portion 11, primarily made of polycrystalline silicon, is formed over intermediate insulating layer 9. In this instance, the polycrystalline silicon of upper lead portion 11 enters into contact hole 10 and is brought into direct contact with the surface of diffusion layer 5b. That is, a direct contact between polycrystalline silicon layers results. Accordingly, similar to the first embodiment, upper lead layer portion 11 serving as the second lead portion formed of polycrystalline silicon can be formed over the first lead portion which includes titanium silicide layer 8 with excellent ohmic contact and high reliability.

In the above described method, a titanium silicide layer is not formed on a predetermined connecting portion at an initial stage of the process so as to realize the direct contact of the polycrystalline silicon layers. However, according to another possible method, a silicide layer is formed over an entire surface of the gate electrode 6, and then a necessary portion of the silicide layer is removed by using a mask which exposes only the portion of the silicide layer which is to be removed.

Further, experiments have been conducted with respect to an improvement on ohmic contact according to the present invention. That is, comparative experiments were carried out in terms of ohmic contact on the N type polycrystalline silicon layer of a semiconductor device in accordance with the previous proposal shown in FIG. 4E and of a semiconductor device in accordance with the first embodiment of this invention shown in FIG. 1D. Changes in voltage and resistance were measured with respect to a change in electrical current. The mask size for forming the contact hole 10 was $0.8\mu \times 0.8\mu$ and the thickness of the titanium silicide layer was 700 Å.

Figure 1D:
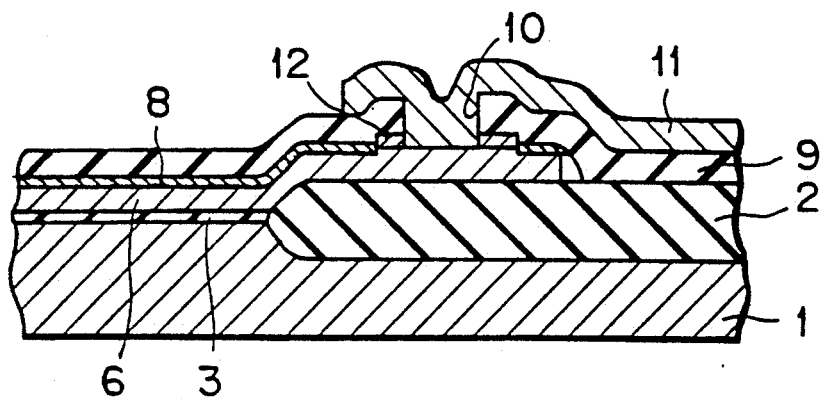
FIG. 1D is a cross-sectional view showing a completed semiconductor device produced according to the first embodiment in which an electrical connection on an N-type polycrystalline silicon layer is achievable.
Figure 3A:
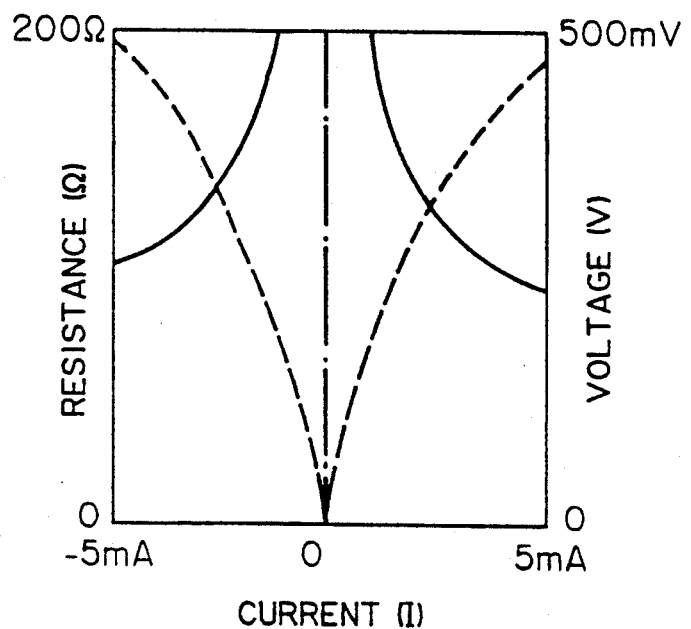
FIG. 3A is a graphical representation showing a characteristic of an electrical connection between first and second lead portions in a semiconductor device according to a proposal made by coworkers and constituting a predecessor to the present invention.
Figure 3B:
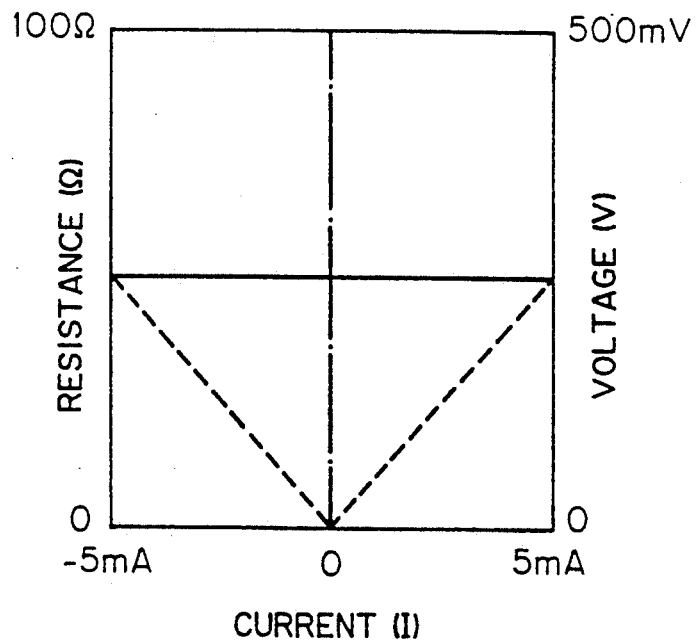
FIG. 3B is a graphical representation showing a characteristic of an electrical connection between first and second lead portions according to the first embodiment of this invention.
Figure 4E:
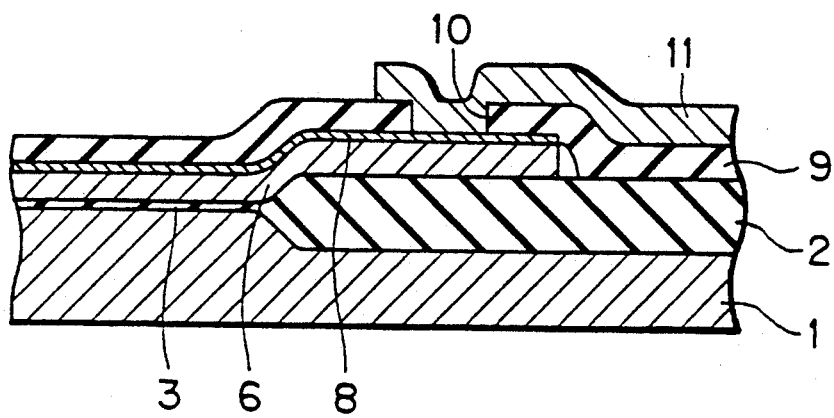
FIG. 4E is a cross-sectional view showing a completed semiconductor device according to another preceding proposal by coworkers in which an electrical connection on an N-type polycrystalline silicon layer is achieved.

A graph shown in FIG. 3A represents data for the semiconductor device of FIG. 4E and a graph shown in FIG. 3B represents data of the semiconductor according to the present invention as shown in FIG. 1D. In these graphs, solid lines indicate resistance variation, and broken lines indicate voltage variation in accordance with the change in applied electrical current. As is apparent from these graphs, in the semiconductor device of FIG. 4E, the resistance value was extremely large, in the $K\Omega$ range, if a low level electrical current flowed, (if a low level voltage was applied). On the other hand, according to the present invention, the resistance level was maintained at a substantially constant low value regardless of the change in electrical current and voltage. Thus, it can be concluded that desirable and sufficient ohmic contact can be exhibited with the present invention.

Figure 6:
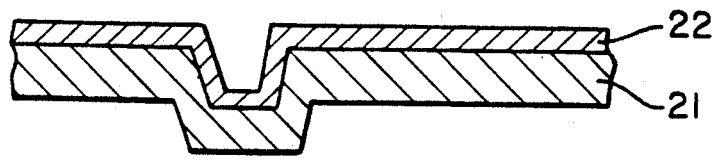
FIG. 6 is a cross-sectional detail view of an alternative form of one lead portion of a device according to the invention.

Additionally, in the case that the second lead layer consists of two layers: a polycrystalline silicon layer 21; and a refractory metal or refractory metal silicide layer 22, as shown in FIG. 6, it is clear that the present invention is applicable when the lower layer 21 of the second lead layer that contacts directly to the first lead layer is polycrystalline silicon. Exemplary materials for layer 22 include: Mo, W, Ti, $MoSi_2$, $WSi_2$ and $TiSi_2$. Alternatively, layer 22 may be composed of Nb, Zr, or Ta or silicides of these metals.

As described above, in a semiconductor device according to the present invention, desirable ohmic contact is obtainable in case of the electrical connection of the polycrystalline silicon layer serving as the upper or the second lead portion with the first lead portion in spite of the employment of the titanium silicide layer. The thus provided semiconductor device will exhibit high reliability and durability while maintaining sufficiently good ohmic contact.

This application relates to subject matter disclosed in Japanese Application numbers 210806/90, filed on Aug.

9, 1990 and 175392/91, filed on Jul. 16, 1991, the disclosures of which are incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method for producing a semiconductor device comprising the steps of:
    providing a substrate having a surface;
    forming a polycrystalline silicon layer containing impurities at the surface of the substrate;
    forming an oxide film layer in a limited area on the polycrystalline silicon layer;
    forming a titanium silicide layer over the polycrystalline silicon layer outside of the limited area occupied by the oxide film layer for providing a first lead layer in combination with the polycrystalline silicon layer;
    forming an intermediate insulating layer over the titanium silicide layer and the oxide film layer;
    forming a contact hole through the intermediate insulating layer in the limited area and through the oxide film layer, the contact hole extending to the polycrystalline silicon layer underneath the oxide film layer; and
    forming a second lead layer made up of a layer of polycrystalline silicon over the intermediate insulating layer, and causing polycrystalline silicon of the second lead layer to extend into the contact hole for establishing direct conductive contact between the polycrystalline silicon of the second lead layer and the polycrystalline silicon layer of the first lead layer.

2. A method for producing a semiconductor device as claimed in claim 1 wherein said step of forming a second lead layer comprises forming an upper layer of a refractory metal or a refractory metal silicide upon the polycrystalline silicon layer of the second lead layer.

* * * * *